US010365123B2

(12) United States Patent
Lee et al.

(10) Patent No.: US 10,365,123 B2
(45) Date of Patent: Jul. 30, 2019

(54) ANISOTROPIC MAGNETO-RESISTIVE (AMR) ANGLE SENSOR

(71) Applicant: TEXAS INSTRUMENTS INCORPORATED, Dallas, TX (US)

(72) Inventors: Dok Won Lee, Mountain View, CA (US); Erika Lynn Mazotti, San Martin, CA (US); William David French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/656,749

(22) Filed: Jul. 21, 2017

(65) Prior Publication Data

US 2019/0025086 A1   Jan. 24, 2019

(51) Int. Cl.
G01D 5/16 (2006.01)
G01D 5/14 (2006.01)
G01R 33/09 (2006.01)

(52) U.S. Cl.
CPC .............. *G01D 5/16* (2013.01); *G01D 5/145* (2013.01); *G01R 33/09* (2013.01)

(58) Field of Classification Search
CPC ...................................... G01D 5/16
USPC .................................. 324/207.21
See application file for complete search history.

(56) References Cited

U.S. PATENT DOCUMENTS 6,433,545 B1 * 8/2002 Kunze ................... G01R 33/09
                                                        324/207.21
6,633,462 B2  10/2003 Adelerhof
6,831,458 B2 * 12/2004 Haji-Sheikh ........... G01R 33/09
                                                        324/252
8,885,302 B1  11/2014 David et al.
9,030,199 B2   5/2015 Liou et al.
9,377,327 B2   6/2016 Kubik
(Continued)

FOREIGN PATENT DOCUMENTS

DE        4438715 C1    10/1994

OTHER PUBLICATIONS

PCT Search Report dated Oct. 25, 2018.
Dok Won Lee et al., "Integrated Anisotropic Magnetoresistive Device" U.S. Appl. No. 15/041,575, filed Feb. 11, 2016.

*Primary Examiner* — Reena Aurora
(74) *Attorney, Agent, or Firm* — Rose Alyssa Keagy; Charles A. Brill; Frank D. Cimino

(57) ABSTRACT

Some embodiments are directed to an anisotropic magneto-resistive (AMR) angle sensor. The sensor comprises a first Wheatstone bridge comprising a first serpentine resistor, a second serpentine resistor, a third serpentine resistor, and a fourth serpentine resistor. The sensor also comprises a second Wheatstone bridge comprising a fifth serpentine resistor, a sixth serpentine resistor, a seventh serpentine resistor, and an eighth serpentine resistor. The serpentine resistors comprise anisotropic magneto-resistive material that changes resistance in response to a change in an applied magnetic field. The sensor also includes a surrounding of anisotropic magneto-resistive material disposed in substantially a same plane as the serpentine resistors, enclosing the serpentine resistors, and electrically isolated from the serpentine resistors. The first Wheatstone bridge, the second Wheatstone bridge, and the surrounding of anisotropic magneto-resistive material are part of a sensor die.

23 Claims, 10 Drawing Sheets

(56) References Cited

U.S. PATENT DOCUMENTS

| | | |
|---|---|---|
| 9,620,707 B2 | 4/2017 | Zimmer et al. |
| 2004/0087037 A1 | 5/2004 | Berg et al. |
| 2005/0277292 A1 | 12/2005 | Peng et al. |
| 2013/0241543 A1 | 9/2013 | Stenson et al. |
| 2014/0210024 A1 | 7/2014 | Lin |
| 2015/0091559 A1 | 4/2015 | Erie et al. |
| 2015/0194597 A1 | 7/2015 | Fermon |
| 2015/0340594 A1 | 11/2015 | Liou et al. |

* cited by examiner

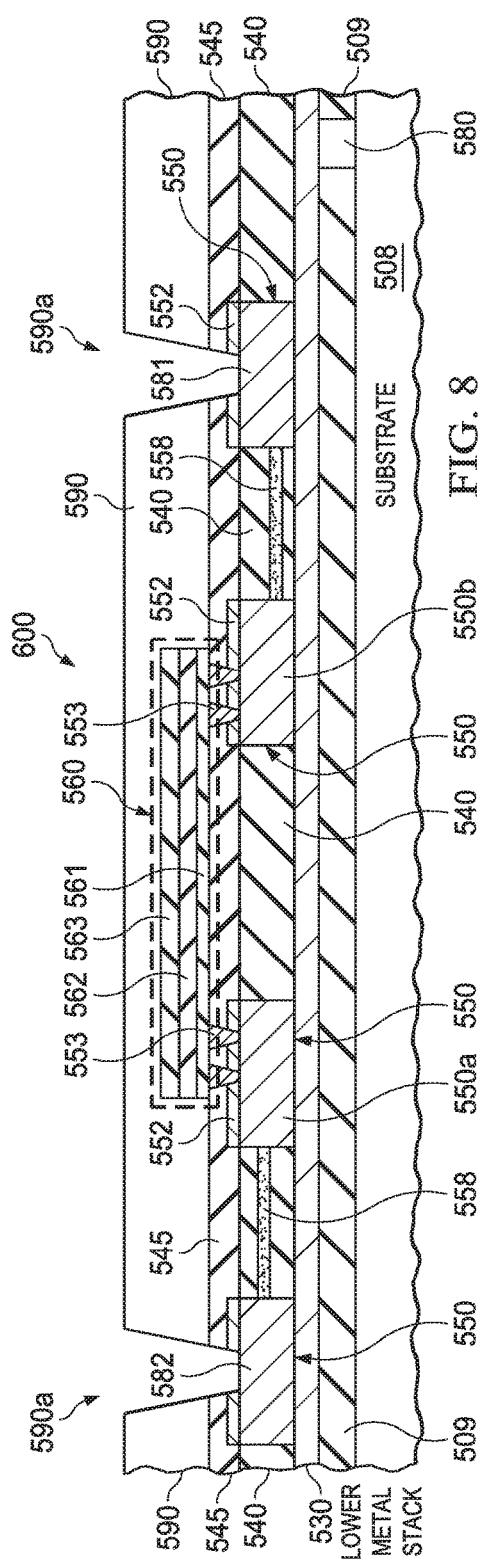
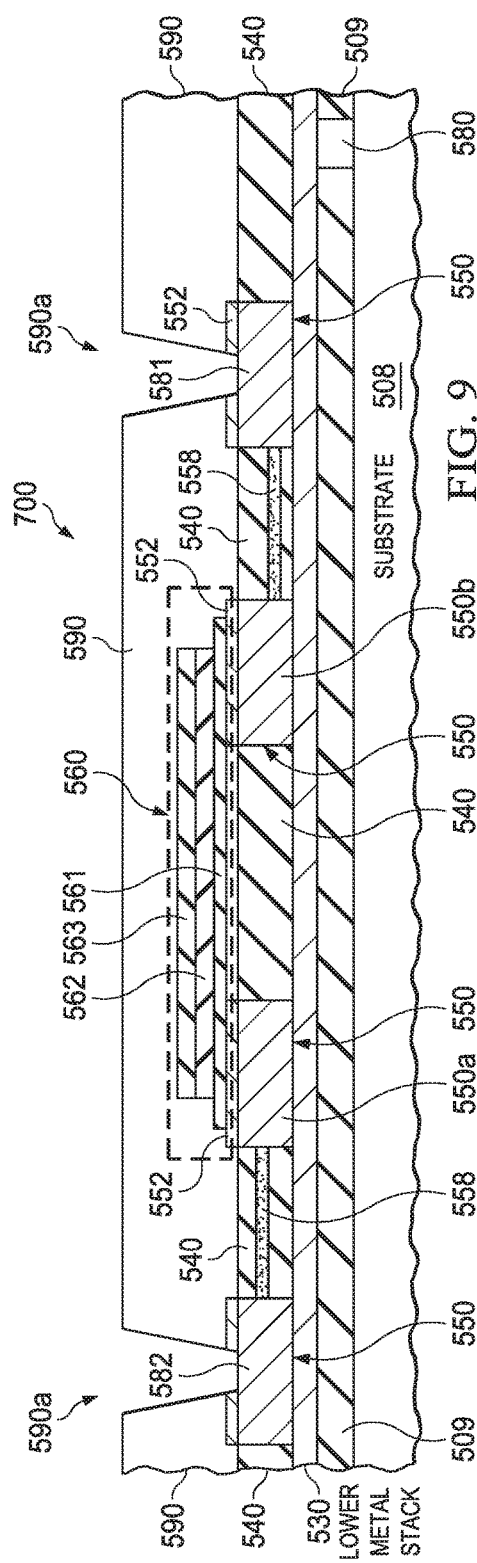
FIG. 8
FIG. 9

ANISOTROPIC MAGNETO-RESISTIVE (AMR) ANGLE SENSOR

BACKGROUND

Anisotropic magneto-resistive material changes the value of its electrical resistance in response to a change in an externally applied magnetic field, for example in response to a change in direction of the externally applied magnetic field. Anisotropic magneto-resistive (AMR) angle sensors exploit this property to develop an indication of angular position such as angular position of a shaft. In a typical embodiment, an AMR sensor is disposed in a fixed location, a magnet is attached to a rotating shaft proximate to the AMR sensor, and the AMR sensor develops an indication of the angular position of the shaft in response to changing orientation of the magnetic field produced by the rotating magnet.

SUMMARY

Some embodiments are directed to an anisotropic magneto-resistive (AMR) angle sensor. The sensor comprises a first Wheatstone bridge comprising a first serpentine resistor, a second serpentine resistor, a third serpentine resistor, and a fourth serpentine resistor. The sensor also comprises a second Wheatstone bridge comprising a fifth serpentine resistor, a sixth serpentine resistor, a seventh serpentine resistor, and an eighth serpentine resistor. The serpentine resistors comprise anisotropic magneto-resistive material that changes resistance in response to a change in an applied magnetic field. The sensor also includes a surrounding of anisotropic magneto-resistive material disposed in substantially a same plane as the serpentine resistors, enclosing the serpentine resistors, and electrically isolated from the serpentine resistors. The first Wheatstone bridge, the second Wheatstone bridge, and the surrounding of anisotropic magneto-resistive material are part of a sensor die.

Some embodiments are directed to an anisotropic magneto-resistive (AMR) angle sensor, comprising a first Wheatstone bridge that includes a first serpentine resistor, a second serpentine resistor, a third serpentine resistor, and a fourth serpentine resistor. The sensor also comprises a second Wheatstone bridge comprising a fifth serpentine resistor, a sixth serpentine resistor, a seventh serpentine resistor, and an eighth serpentine resistor. The serpentine resistors each define a substantially trapezoidal polygon disposed in substantially a same plane as the other serpentine resistors. The serpentine resistors are disposed to define a substantially regular octagonal polygon. The fifth serpentine resistor is located between the first serpentine resistor and the second serpentine resistor, the sixth serpentine resistor is located between the second serpentine resistor and the third serpentine resistor, the seventh serpentine resistor is located between the third and the fourth serpentine resistor, and the eighth serpentine resistor is located between the fourth serpentine resistor and the first serpentine resistor. The serpentine resistors comprise anisotropic magneto-resistive material that changes resistance in response to a change in an externally-applied magnetic field. The sensor also includes a surrounding of anisotropic magneto-resistive material disposed in substantially the same plane as the serpentine resistors, enclosing the serpentine resistors and electrically isolated from the serpentine resistors.

In some embodiments, an anisotropic magneto-resistive (AMR) angle sensor die comprises a first Wheatstone bridge comprising a first serpentine resistor, a second serpentine resistor, a third serpentine resistor, and a fourth serpentine resistor. The sensor die also includes a second Wheatstone bridge comprising a fifth serpentine resistor, a sixth serpentine resistor, a seventh serpentine resistor, and an eighth serpentine resistor. Each of the serpentine resistors defines a substantially trapezoidal polygon disposed in substantially the same plane as the other serpentine resistors. The serpentine resistors are disposed to define a substantially regular octagonal polygon. The fifth serpentine resistor is located between the first serpentine resistor and the second serpentine resistor, the sixth serpentine resistor is located between the second serpentine resistor and the third serpentine resistor, the seventh serpentine resistor is located between the third and the fourth serpentine resistor, and the eighth serpentine resistor is located between the fourth serpentine resistor and the first serpentine resistor. The serpentine resistors comprise anisotropic magneto-resistive material that changes resistance in response to a change in an externally-applied magnetic field. The sensor die also includes a surrounding of anisotropic magneto-resistive material disposed in substantially the same plane as the serpentine resistors, enclosing an outer perimeter of the regular octagonal polygon defined by the serpentine resistors, disposed between the serpentine resistors, and electrically isolated from the serpentine resistors.

In an embodiment, a method of forming an integrated device is disclosed. The method comprises providing a substrate having a semiconductor surface layer including functional circuitry, a lower metal stack on the semiconductor surface layer, an interlevel dielectric (ILD) layer on the lower metal stack, a top metal layer providing AMR contact pads and bond pads coupled to the AMR contact pads in the ILD layer and forming an anisotropic magneto-resistive (AMR) device above the lower metal stack lateral to the functional circuitry including depositing an AMR stack including a seed layer, an AMR material layer then a capping layer, wherein the seed layer is coupled to the AMR contact pads. The method further comprises patterning the AMR stack, comprising isolating a surrounding of magneto-resistive material from a plurality of serpentine resistors of the AMR stack, depositing a protective overcoat (PO layer) over the AMR stack, and etching openings in the POP layer to reveal the bond pads.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

FIG. 8 is cross-sectional view of an example integrated device including an anisotropic magneto-resistive (AMR) angle sensor having metal filled vias coupling the seed layer to the AMR contact pads, according to an embodiment of the disclosure.

FIG. 9 is a cross-sectional view of another example integrated device including an anisotropic magneto-resistive (AMR) angle sensor having the seed layer directly on refractory metal pads on AMR contact pads, according to an embodiment of the disclosure.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

Anisotropic magneto-resistive (AMR) angle sensors may be able to resolve angular displacement to a high degree of accuracy, for example to about ±0.1 degree. In some implementations, however, this optimal accuracy is decreased by what may be referred to as shape anisotropy in the anisotropic magneto-resistive elements of the sensor (e.g., in the disposition of serpentine resistors in the two Wheatstone bridges composing the sensor). The present disclosure teaches reducing shape anisotropy in an AMR angle sensor by reducing the width of etched isolation between resistors and between legs of the serpentine shape of the resistors with reference to previous implementations. The disclosure further teaches reducing shape anisotropy, with reference to previous implementations, by disposing additional anisotropic magneto-resistive material as an outer perimeter or surrounding of the two Wheatstone bridges and between the resistors, where this additional anisotropic magneto-resistive material is electrically isolated from the resistors. While these techniques may advantageously be practiced independently of each other in some implementations, the techniques can be combined in a single implementation to achieve yet greater reduction of shape anisotropy than either technique can achieve alone.

Figure 1:
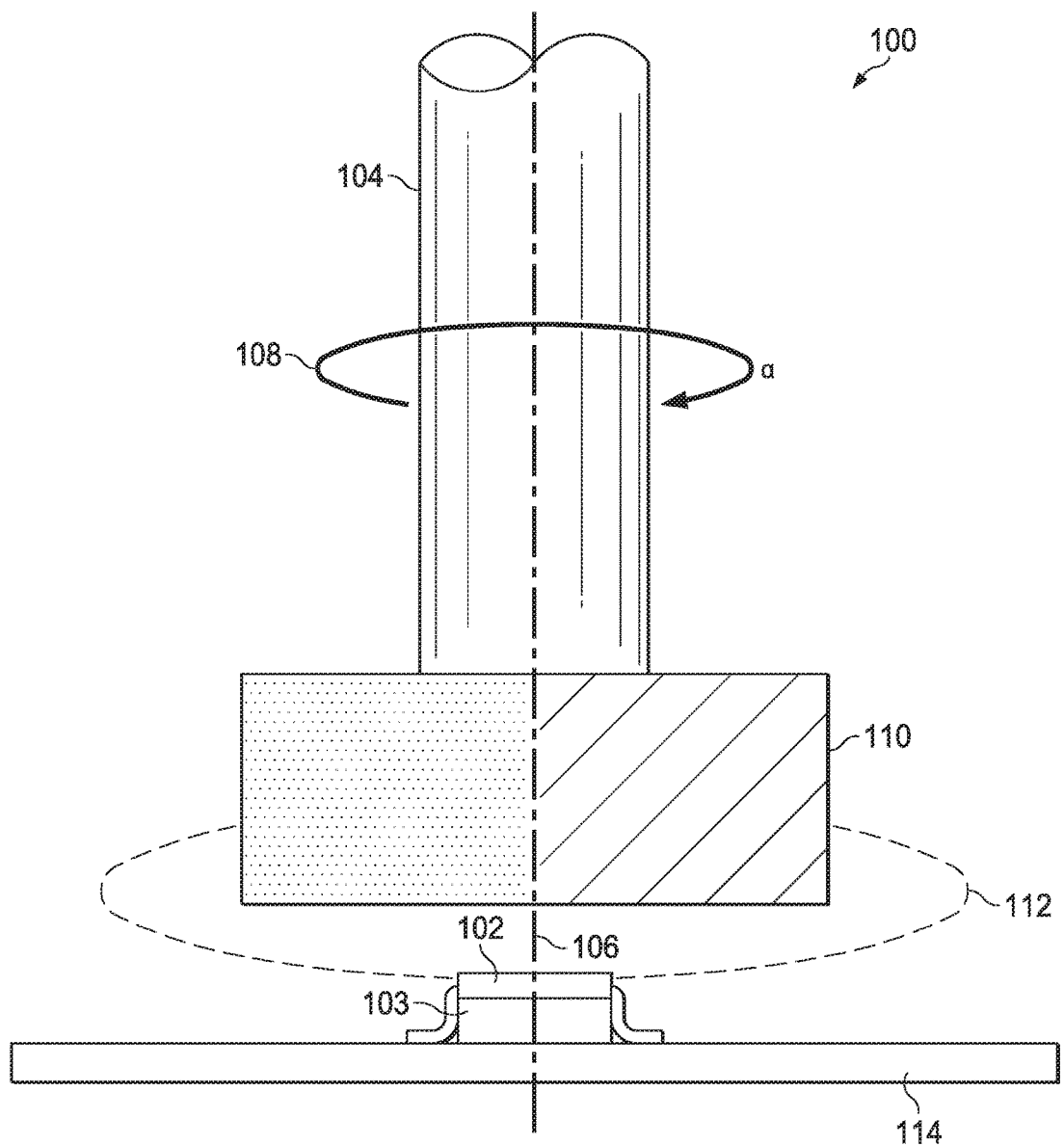
FIG. 1 is a side view illustrating a rotating shaft and an angular rotation sensor according to an embodiment of the disclosure.

Turning now to FIG. 1, an illustrative system 100 is described. In an embodiment, the system 100 comprises an anisotropic magneto-resistive (AMR) angle sensor 102, an optional analog front end (AFE) 103, a shaft 104 having axis of rotation 106 and an angular displacement α 108, and a magnet 110 generating a magnetic field 112. In some contexts the AMR angle sensor 102 may be referred to as an AMR angle sensor die, because the AMR angle sensor 102 may be implemented on a semiconductor substrate along with a plurality of other like AMR angle sensors and then each of the sensors cut apart as separate dies (singular being a 'die'). In an embodiment, the AMR sensor 102 and the optional AFE 103 are coupled to a fixed structure 114, and the shaft 104 is free to rotate about axis 106. In an embodiment, the AMR angle sensor 102 and the AFE 103 are integrated on a semiconductor die (e.g., monolithic integration). In a different embodiment, the AMR angle sensor 102 and the AFE 103 are manufactured separately but packaged together in a packaged part (e.g., in a multi-chip-module-integration package). The AFE 103 may be an integrated circuit formed on a semiconductor substrate that provides analog signal conditioning circuitry of various kinds. The AFE 103 may contain analog circuitry such as operational amplifiers, filters, application specific integrated circuit (ASIC) cores. The AFE 103 may buffer or condition low strength signals for transmitting to a separate component such as microcontroller or microprocessor. The AFE 103 may be thought of as a kind of interface between a sensor, such as the AMR sensor 102, and other circuits.

In an embodiment, the shaft may be a steering wheel, a crank shaft, a shaft of an aircraft control surface, or other rotating shaft. The plane of rotation of the magnet 110 is substantially orthogonal to the axis of rotation 106 (e.g., making an angle within 5 degrees of 90 degrees to the axis of rotation). The plane of rotation of the magnet 110 is substantially parallel to a plane of the AMR sensor 102 (e.g., substantially parallel to a plane of two Wheatstone bridges integral with the AMR sensor 102, as discussed further hereinafter, where 'substantially parallel' means the angle of the plane of rotation of the magnet 110 makes an angle of less than 5 degrees with the plane of the AMR sensor 102). The magnetic field 112 generated by the magnet 110 is substantially parallel to the plane of the AMR sensor 102 where it interacts with the AMR sensor 102. As the magnet 110 rotates (responsive to the shaft 104 rotating), the direction of the magnetic field 112 relative to the plane of the AMR sensor 102 ranges through ±90 degrees.

Figure 2:
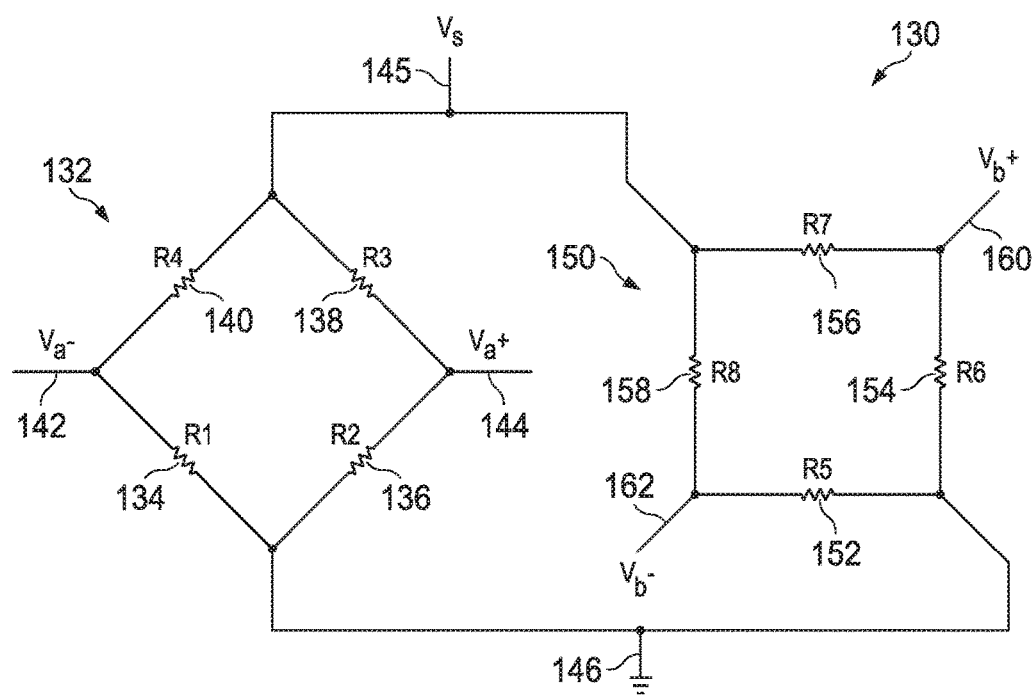
FIG. 2 is an electrical schematic of a pair of Wheatstone bridges according to an embodiment of the disclosure.

Turning now to FIG. 2, an illustrative circuit 130 is described. In an embodiment, the circuit 130 comprises a first Wheatstone bridge 132 and a second Wheatstone bridge 150. The first Wheatstone bridge 132 comprises a first resistor 134, a second resistor 136, a third resistor 138, and a fourth resistor 140. The first resistor 134 and the second resistor 136 are connected to an electrical ground 146 at one end. The third resistor 138 and the fourth resistor 140 are connected to an electrical power source 145 at one end. The first resistor 134 and the fourth resistor 140 are connected to a Va− reference point 142. The second resistor 136 and the third resistor 138 are connected to a Va+ reference point 144. The second Wheatstone bridge 150 comprises a fifth resistor 152, a sixth resistor 154, a seventh resistor 156, and an eighth resistor 158. The fifth resistor 152 and the sixth resistor 154 are connected to the electrical ground 146 at one end. The seventh resistor 156 and the eighth resistor 158 are connected to the electrical power source 145 at one end. The fifth resistor 152 and the eighth resistor 158 are connected to a Vb− reference point 162 at one end. The sixth resistor 154 and the seventh resistor 156 are connected to a Vb+ reference point 160 at one end.

The eight resistors 134, 136, 138, 140, 152, 154, 156, 158 may comprise anisotropic magneto-resistive material, and their resistance values may change as a direction of an external magnetic field changes. For example, the resistors 134, 136, 138, 140, 152, 154, 156, 158 may comprise ferromagnetic materials and alloys. The resistors may comprise nickel, iron, an alloy of nickel and iron, permalloy (i.e., an alloy of nickel-iron comprising 80% nickel and 20% iron, within 5%, more or less, in opposite sense, of each material), mu-metal (i.e., an alloy of nickel-iron comprising 77% nickel, 16% iron, 5% copper, and 2% chromium or molybdenum, within 1% more or less), or other ferromagnetic materials and alloys. In an embodiment, the resistors may comprise 82% nickel and 18% iron, within 2%.

In an embodiment, the circuit 130, which may be referred to in some contexts as a pair of Wheatstone bridges, forms a component of the AMR angle sensor 102. While the circuit 130 is illustrated schematically in FIG. 2 and does not represent a physical layout, it is understood that the resistors of the bridges 132, 150 may be disposed in substantially the same plane. Additionally, the relative angular positions of the resistors illustrated in FIG. 2 may be maintained in a physical realization (e.g., when embodied in the AMR angle sensor 102), which may be better seen in FIG. 4 discussed hereinafter. In operation, a voltage Vs may be applied as an electrical power source 145, for example a DC voltage. In some conditions, each Wheatstone bridge 132, 150 is balanced, although not necessarily at the same time (e.g., when one bridge is balanced, the other bridge may not be balanced). In a balanced condition of the first Wheatstone bridge 132, the voltage difference between Va+ reference point 144 and Va− reference point 142 is zero. In a balanced condition of the second Wheatstone bridge 150, the voltage difference between Vb+ reference point 160 and Vb− reference point 162 is zero. As the generated magnetic field 112 interacts with the circuit 130, however, the resistances change. Because the physical orientation of the resistors is different, the interaction of the generated magnetic field 112 with the circuit 130 affects different resistors differently, thereby unbalancing one or both of the Wheatstone bridges 132, 150. The unbalancing of the one or both Wheatstone bridges 132, 150 thereby causes a non-zero (either a positive or a negative) voltage difference between reference points 142, 144 and/or between the reference points 160, 162. These one or more voltage differences can be processed to determine an angular displacement of the magnet 110 and hence of the shaft 104.

Figure 3:
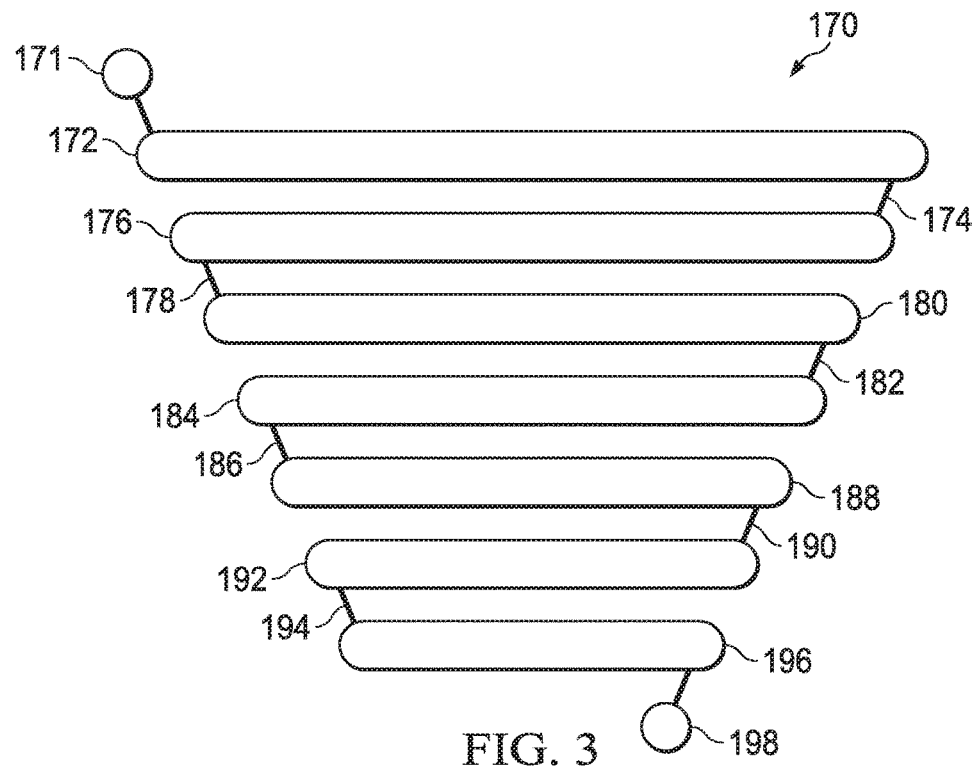
FIG. 3 is a top view illustrating a serpentine resistor according to an embodiment of the disclosure.

Turning now to FIG. 3, an illustrative serpentine resistor 170 is described. The serpentine resistor 170 may be said to have a generally trapezoidal shape or a "keystone" shape and to be generally flat or planar (i.e., a thickness of the serpentine resistor 170 relative to a breadth of the serpentine resistor 170 may have a ratio of 1:10 or less). In an embodiment, the legs of the serpentine resistor 170 may have a thickness of 8 nm to 50 nm and a width of 4 um to 28 um (i.e., a ratio of less than 1:150). The serpentine resistor 170 has a first electrical contact 171 at one end and a second electrical contact 198 at an opposite end. The serpentine resistor 170 comprises a plurality of strips of anisotropic magneto-resistive material, for example material that is deposited as a layer then etched in a semiconductor manufacturing process step. The strips of the serpentine resistor 170 comprise anisotropic magneto-resistive material, such as ferromagnetic materials and alloys. The strips may comprise nickel, iron, an alloy of nickel and iron, permalloy (i.e., an alloy of nickel-iron comprising 80% nickel and 20% iron, within 2%, more or less, in opposite sense of the two materials), mu-metal (i.e., an alloy of nickel-iron comprising 77% nickel, 16% iron, 5% copper, and 2% chromium or molybdenum, within 1% more or less), or other ferromagnetic materials and alloys.

The ends of the strips are electrically connected by metal. As illustrated the serpentine resistor 170 comprises seven strips of anisotropic magneto-resistive material: a first strip 172, a second strip 176, a third strip 180, a fourth strip 184, a fifth strip 188, a sixth strip 192, and a seventh strip 196. The serpentine resistor 170 may comprise any number of interconnected strips of anisotropic magneto-resistive material, either more than seven strips or less than seven strips. The first strip 172 is connected to the first electrical contact 171 at one end and to a first metal conductor 174 at another end. The second strip 176 is connected to the first metal conductor 174 at one end and to a second metal conductor 178 at another end. The third strip 180 is connected to the second metal conductor 178 at one end and to a third metal conductor 182 at another end. The fourth strip 184 is connected to the third metal conductor 182 at one end and to a fourth metal conductor 186 at another end. The fifth strip 188 is connected to the fourth metal conductor 186 at one end and to a fifth metal conductor 190 at another end. The sixth strip 192 is connected to the fifth metal conductor 190 at one end and to a sixth metal conductor 194 at another end. The seventh strip 196 is connected to the sixth metal conductor 194 at one end and to the second electrical contact 198 at another end. In this way, the serpentine resistor 170 is composed of a plurality of substantially parallel strips of anisotropic magneto-resistive material (where substantially means each strip is aligned within 5 degrees, plus or minus, of an axis of the strips). The resistance of the serpentine resistor 170 is the sum of the resistances of the parallel strips 172, 176, 180, 184, 199, 192, and 196. The metal conductors 174, 178, 182, 186, 190, and 194 contribute negligible resistance to the serpentine resistor 170.

In an embodiment, the resistors of the Wheatstone bridges 130, 132 may have a different form. For example, the segments of the resistors may be of equal length. There may be fewer or more number of segments of the resistors. The resistor may not be serpentine but may comprise a single segment.

Figure 4:
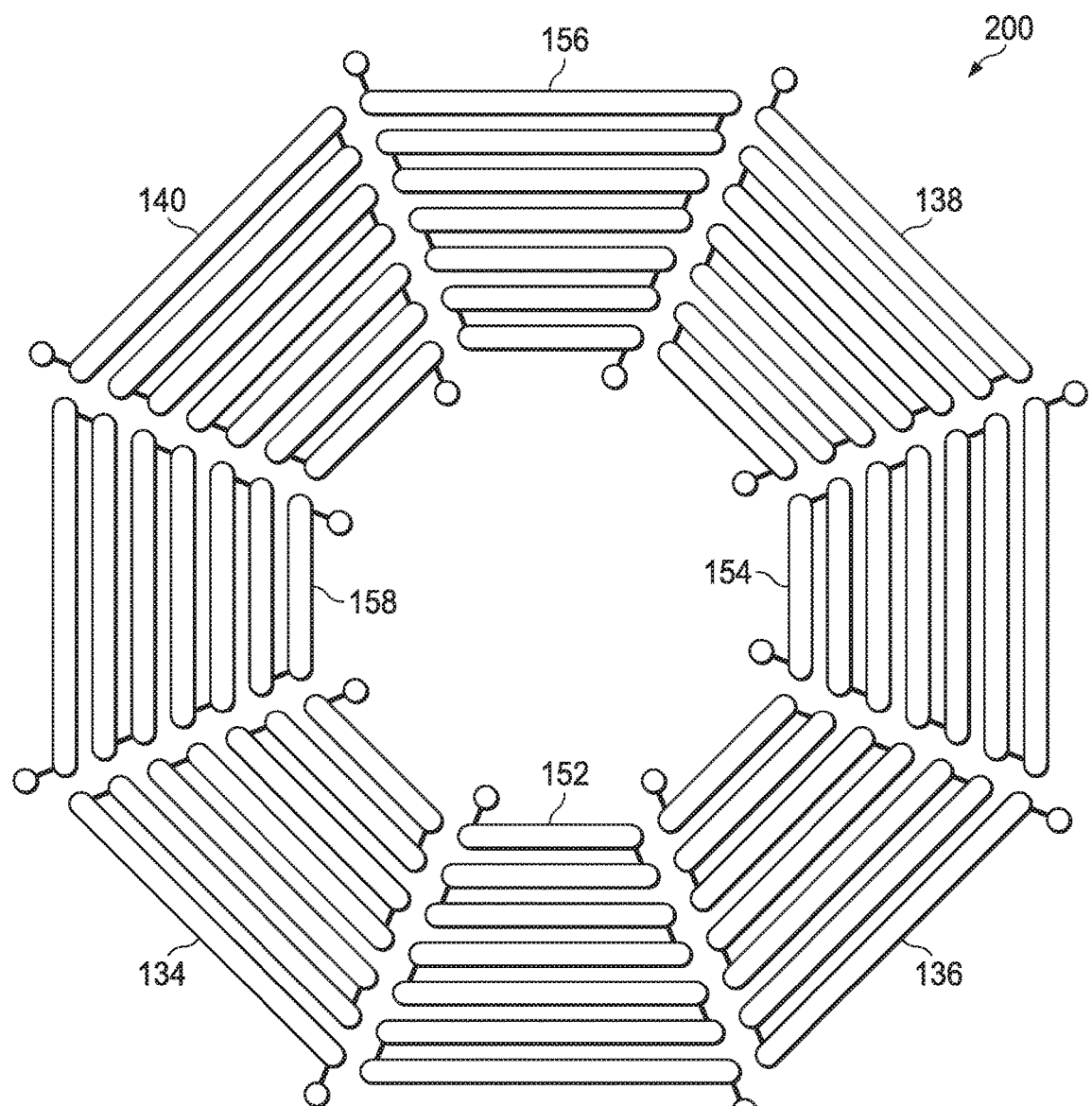
FIG. 4 is a top view illustrating eight serpentine resistors disposed in an octagonal arrangement according to an embodiment of the disclosure.

Turning to FIG. 4, an illustrative octagonal disposition of serpentine resistors 200 is described. Each of the serpentine resistors may be similar to the serpentine resistor 170 described above with reference to FIG. 3. By connecting the serpentine resistors appropriately, the circuit 130 of FIG. 2 may be established. In another embodiment, the circuit 130 of FIG. 2 may be established in another shape, for example in a shape that is not octagonal. Thus, the octagonal disposition of serpentine resistors 200 comprises the first resistor 134, the second resistor 136, the third resistor 138, and the fourth resistor 140 connected to establish the first Wheatstone bridge 132 and the fifth resistor 152, the sixth resistor 154, the seventh resistor 156, and the eighth resistor 158 connected to establish the second Wheatstone bridge 150. The resistors 134, 136, 138, 140, 152, 154, 156, 158 may be manufactured using a semiconductor manufacturing process by depositing anisotropic magneto-resistive material on a substantially flat surface, such as on a dielectric or insulating layer and then etching to electrically isolate the strips of the resistors from each other.

Each of the resistors 134, 136, 138, 140, 152, 154, 156, 158 is aligned 45 degrees differently, either in a positive sense or a negative sense, to the adjacent resistors. The strips of the first resistor 134 and the third resistor 138 are substantially parallel to each other and orthogonal to the strips of the second resistor 136 and the fourth resistor 140, the strips of which are substantially parallel to each other. The strips of the fifth resistor 152 and the seventh resistor 156 are substantially parallel to each other and orthogonal to the strips of the sixth resistor 154 and the eighth resistor 158 which are substantially parallel to each other. By 'substantially parallel' it is meant that a parallel strip makes an angle of less than 5 degrees with other parallel strips. The strips of anisotropic magneto-resistive material of the first resistor 134 are offset by about −45 degrees or about +45 degrees to the strips of anisotropic magneto-resistive material of the fifth resistor 152 and the strips of anisotropic magneto-resistive material of the eighth resistor 158. The term 'by about' here means the angle offset is within ±5 degrees of the designated angle offset. The resistors 134, 136, 138, 140, 152, 154, 156, and 158 are located in substantially the same plane. By 'substantially the same plane' it is meant that the plane of each resistor makes an angle of less than 5 degrees with the plane of any other of the resistors.

Figure 5A:
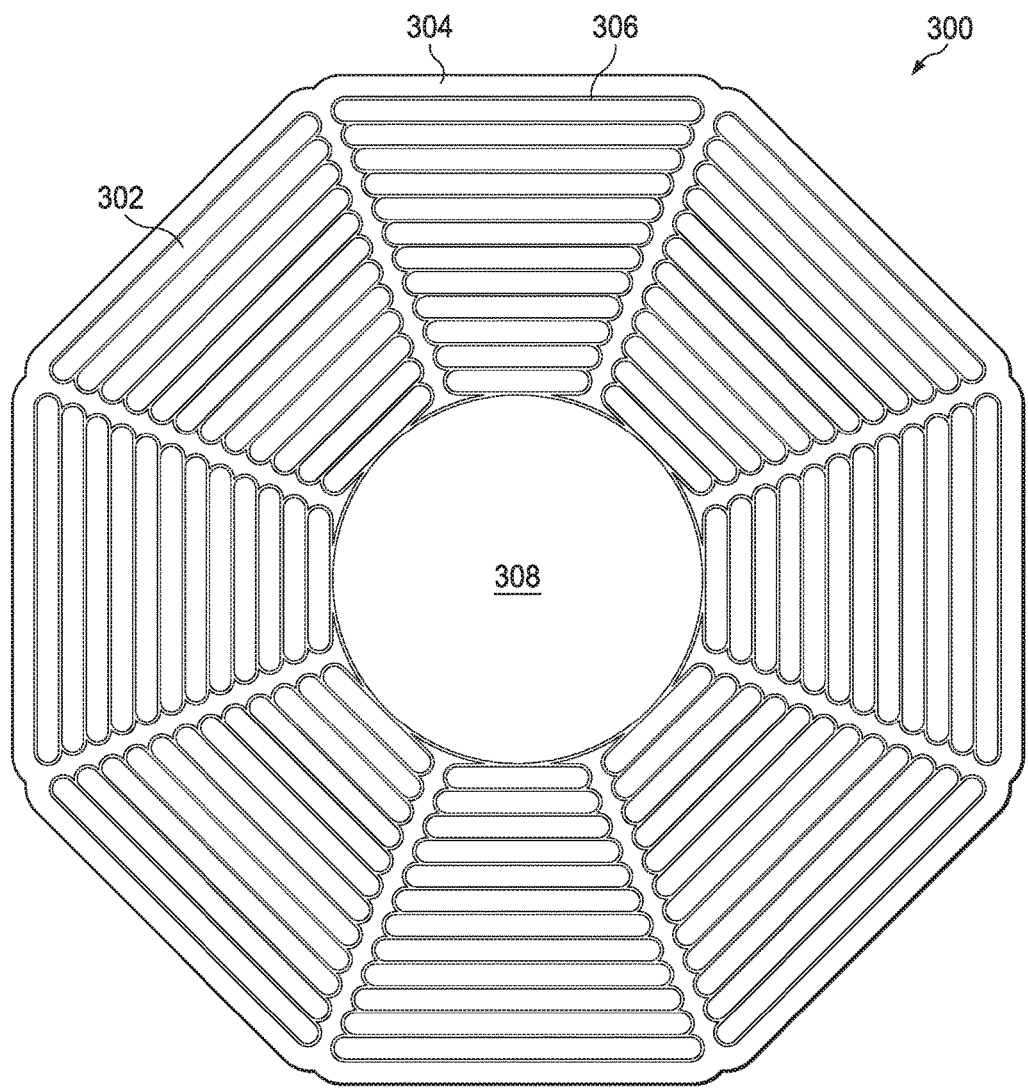
FIG. 5A is a top view illustrating an anisotropic magneto-resistive (AMR) angle sensor according to an embodiment of the disclosure.

Turning now to FIG. 5A, an illustrative AMR sensor 300 is described. The AMR sensor 300 comprises eight serpentine resistors disposed as described with reference to FIG. 4 above and interconnected to form the circuit 130 described above with reference to FIG. 2. The AMR sensor 300 may be referred to in some contexts as an AMR sensor die. The AMR sensor 300 may be used to implement the AMR angle sensor 102 described above. The interconnections among strips of individual resistors is not shown and the interconnections to establish the circuit of 130 are not shown to avoid cluttering FIG. 5. These interconnections may be established by a metal layer below or above a dielectric or insulating layer located either above or below the layer containing the eight serpentine resistors and by metal vias through the dielectric or insulating layer.

The strips of anisotropic magneto-resistive material 302 are separated by narrow gaps 306. The AMR sensor 300 comprises a surrounding of anisotropic magneto-resistive material 304 that encloses an outer perimeter of the octagonal disposition of eight serpentine resistors. The surrounding of anisotropic magneto-resistive material 304 further is disposed between the serpentine resistors and isolated from the serpentine resistors The surrounding of anisotropic magneto-resistive material 304 is planar in shape and is disposed in substantially the same plane as a plane of the eight serpentine resistors. y 'substantially the same plane' it is meant that the plane of the surrounding of anisotropic magneto-resistive material 304 makes less than an angle of 5 degrees with the plane of the eight serpentine resistors. In an embodiment, the surrounding of anisotropic magneto-resistive material 304 is electrically isolated from the serpentine resistors. In an embodiment, the surrounding of anisotropic magneto-resistive material 304 may not be connected to ground or power and may be electrically floated. By surrounding the serpentine resistors in the way described and illustrated, the shape anisotropy of the AMR sensor 300 is reduced with reference to sensors that lack the additional anisotropic magneto-resistive material surrounding and separating the serpentine resistors. In an embodiment, the AMR sensor 300 further comprises an isolated, generally circular core 308 that comprises anisotropic magneto-resistive material that also contributes to the reduced shape anisotropy of the AMR sensor 300.

In an embodiment of the AMR sensor 300, the separation between strips is reduced, relative to previous implementations, which further reduces the shape anisotropy of the AMR sensor 300 relative to previous implementations. In an embodiment, the separation may be less than 2 μm, less than 1 μm, less than 0.5 μm, or less than 0.25 μm. The separation may be referred to as engraving. The separation may be established by exposing a layer of resist, superimposing a mask, exposing the resist through the mask, and etching away the anisotropic magneto-resistive material in a narrow band to form the separations. The strips 302, the surrounding 304, and the core 308 may comprise the same anisotropic magneto-resistive material and be formed from the same material layer.

Figure 5B:
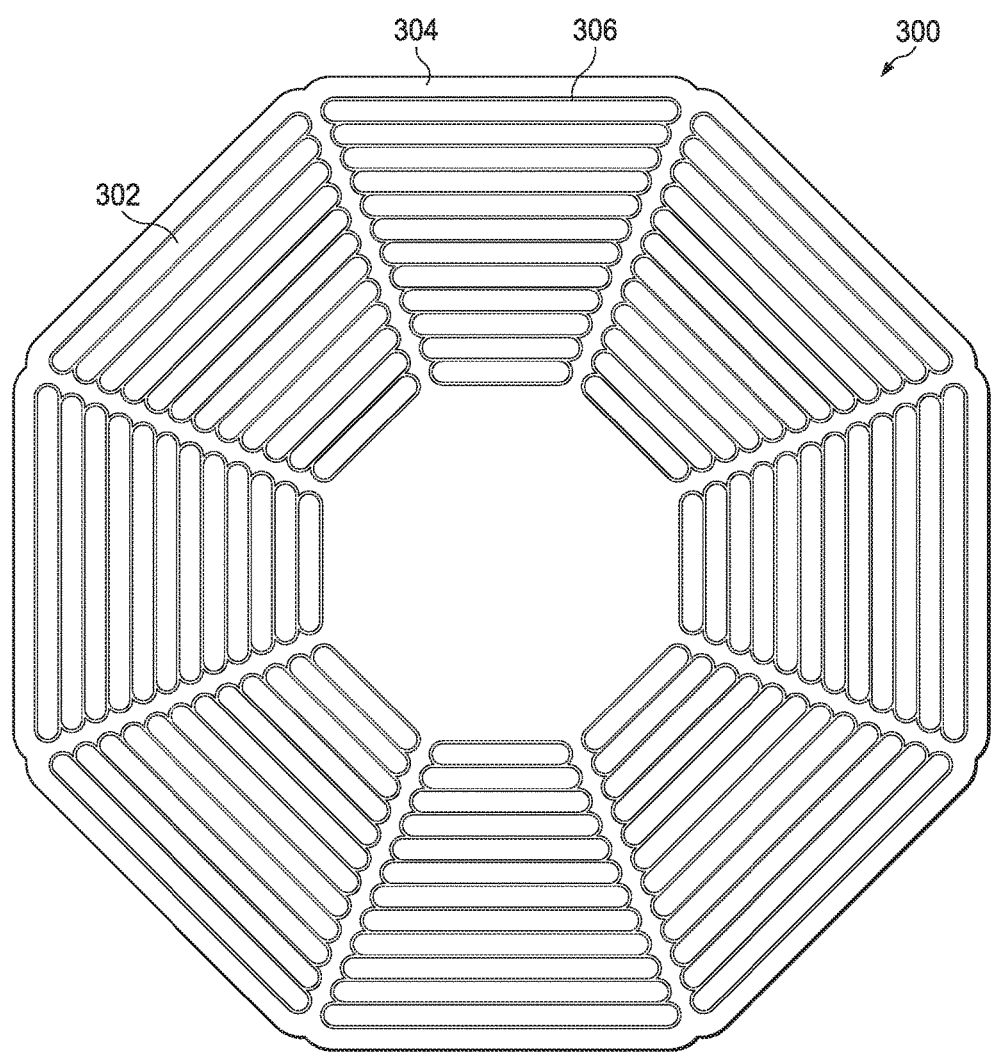
FIG. 5B is a top view illustrating an anisotropic magneto-resistive (AMR) angle sensor according to another embodiment of the disclosure.

Turning now to FIG. 5B, an alternative embodiment of the AMR sensor 300 is described. In this embodiment, the surrounding of anisotropic magneto-resistive material 304 continues into the center of the generally octagonal shape of the AMR sensor 300 and there is no separation of this central portion from the surrounding of anisotropic magneto-resistive material 304.

Figure 5C:
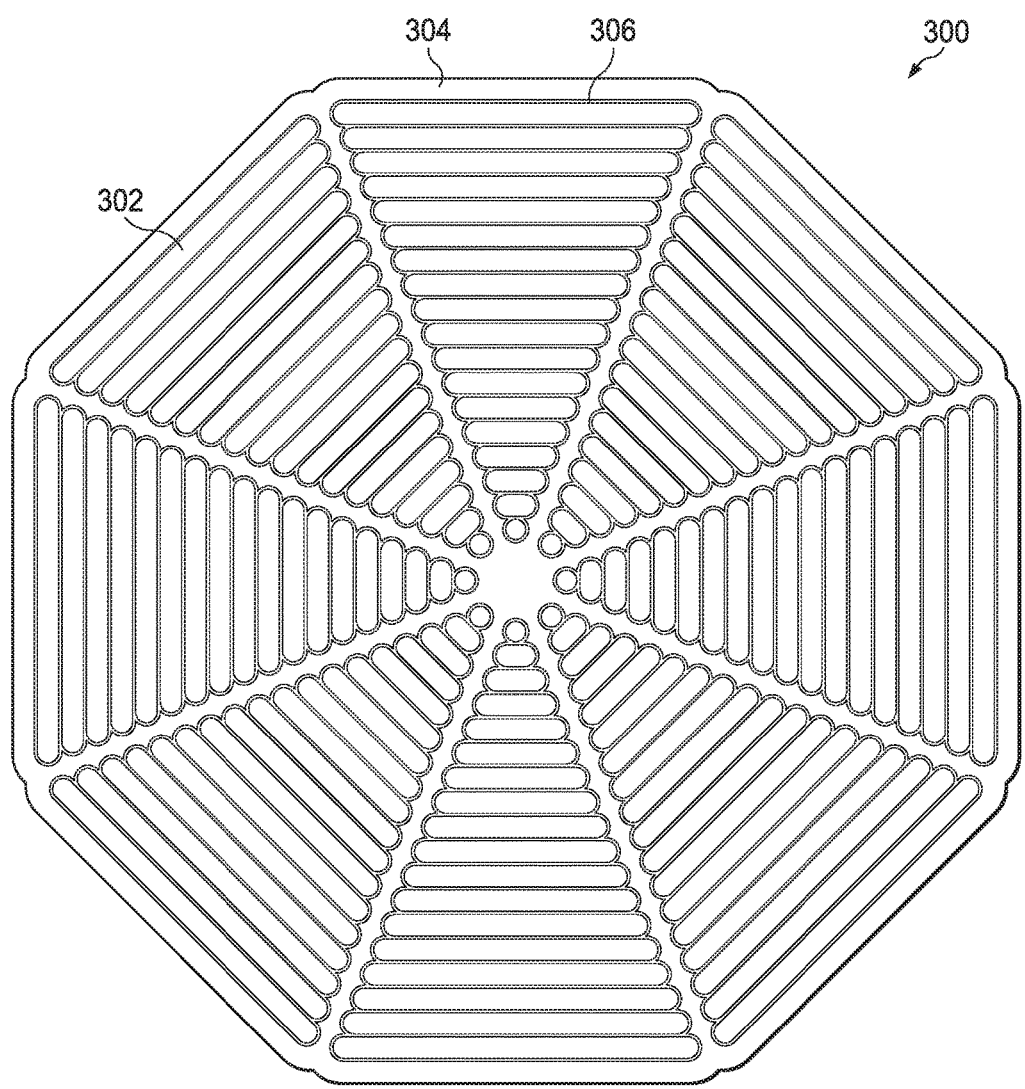
FIG. 5C is a top view illustrating an anisotropic magneto-resistive (AMR) angle sensor according to yet another embodiment of the disclosure.

Turning now to FIG. 5C, another alternative embodiment of the AMR sensor 300 is described. In this embodiment, the strips of anisotropic magneto-resistive material 302 are continued further (relative to the embodiment of FIG. 5B) into the center of the generally octagonal shape of the AMR sensor 300.

Figure 5D:
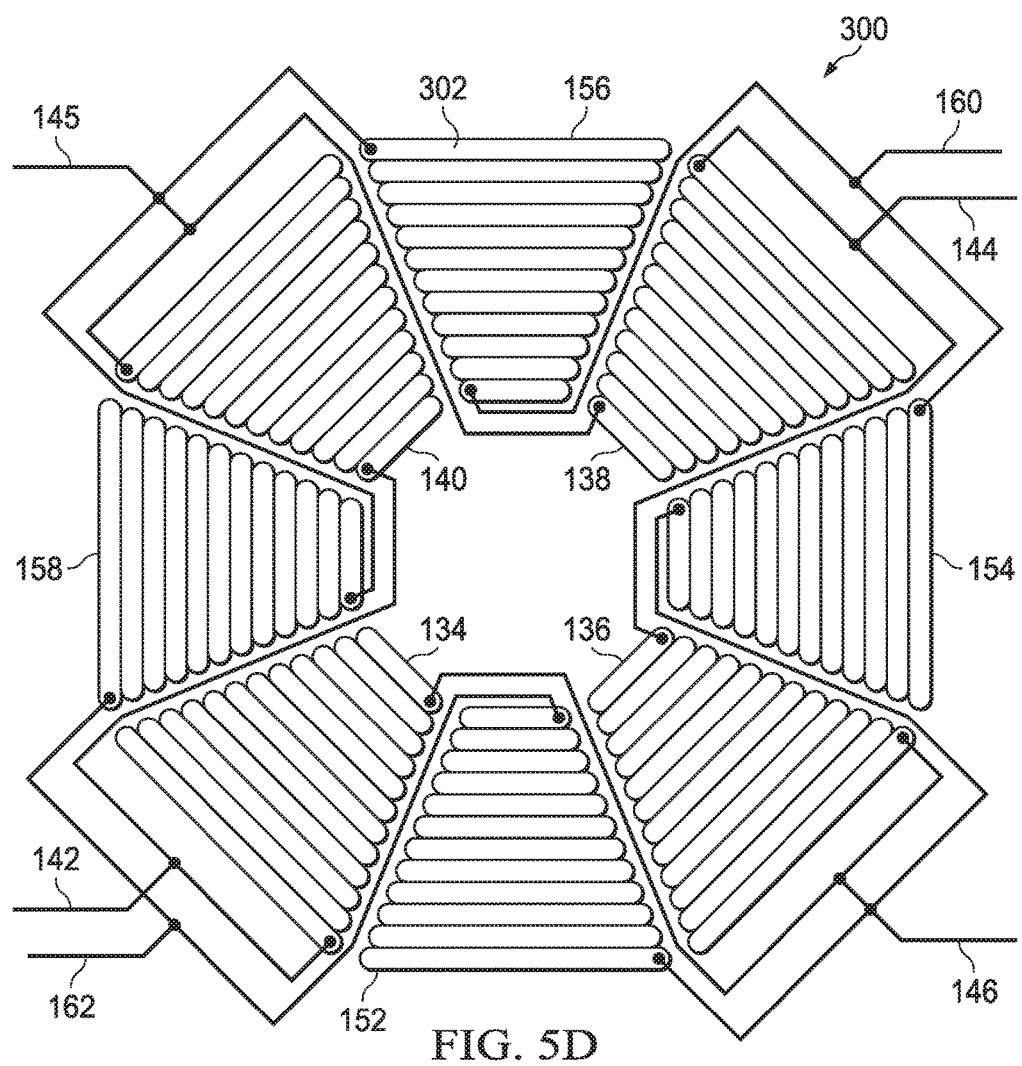
FIG. 5D is a top view illustrating electrical connections among serpentine resistors of an anisotropic magneto-resistive (AMR) angle sensor according to an embodiment of the disclosure.

Turning now to FIG. 5D, a view of the AMR sensor 300 illustrating connections of serpentine resistors 170 is described. The illustration of the AMR sensor 300 omits details of the narrow gaps 306 and of the surrounding of anisotropic magneto-resistive material 304. In other embodiments, other arrangements of connections 142, 144, 145, 146, 160, 162 may be employed to connect the serpentine resistors 170.

Figure 6:
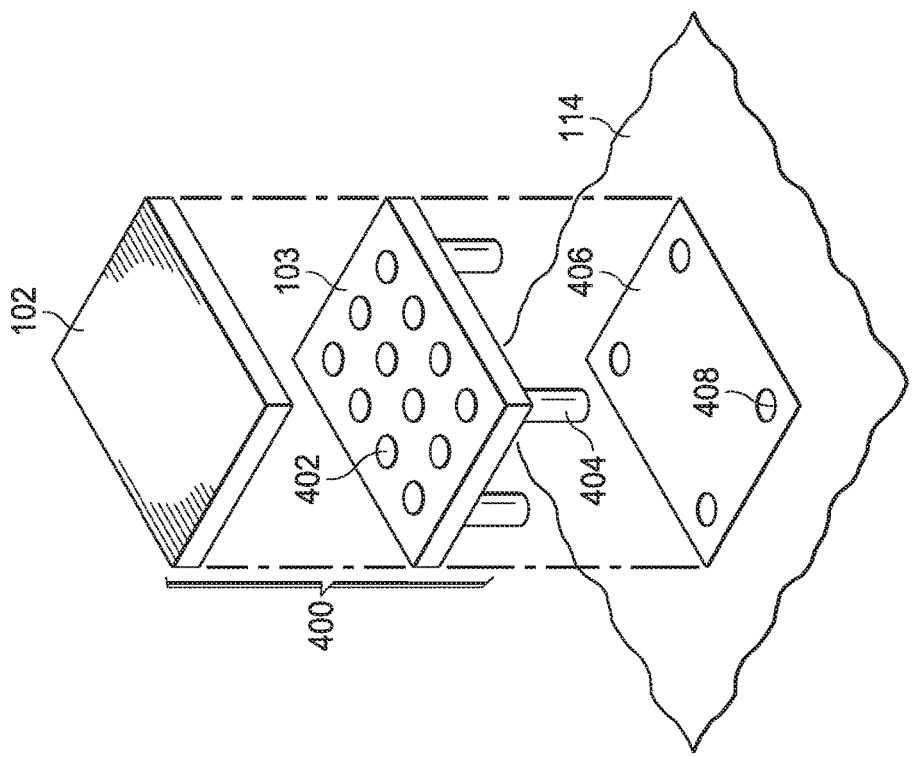
FIG. 6 is a three-dimensional view illustrating an anisotropic magneto-resistive (AMR) sensor die and an analog front end (AFE) according to an embodiment of the disclosure.

Turning now to FIG. 6, an illustrative AMR angle sensor package 400 is described. In an embodiment, an anisotropic magneto-resistive (AMR) angle sensor 102 (e.g., AMR sensor 300) is electrically connected to an analog front end (AFE) 103 to form the AMR angle sensor package 400. The AFE 103 may provide a plurality of electrical contacts 402 to electrically connect to the AMR angle sensor 102, for example using solder balls or another connection technology. The AMR angle sensor package 400 may electrically connect to a connector 406 mounted on the fixed structure 114. The AFE 103 may provide a plurality of jacks 404 to connect to a plurality of sockets 408 of the connector 406. The sockets 408 may provide power and ground to the AFE 103, and the AFE 103 may provide conditioned power to the AMR angle sensor 102. In an embodiment, the AMR angle sensor 102 and the AFE 103 are integrated on a single die (e.g., by monolithic integration).

The AFE 103 may receive signal outputs from the AMR angle sensor 102, for example signal outputs from Va+ reference point 144, Va− reference point 142, Vb+ reference point 160, and Vb− reference point 162. The AFE 103 may buffer these signal outputs, for example conditioning the signal outputs with one or more operational amplifiers to make the outputs more robust. This may be referred to as the AFE 103 signal conditioning the signal outputs received from the AMR angle sensor 102 or providing signal conditioning to the signal outputs received from the AMR angle sensor 102 in some contexts. The AFE 103 may amplify and/or signal shift the outputs of the reference points 142, 144, 160, 162. The AFE 103 may combine or derive an indication that simplifies the outputs, for example generating a sin(α) analog output and a cos(α) analog output from the four outputs from reference points 142, 144, 160, 162. The AMR angle sensor 102 and the AFE 103 may be enclosed in a package (not shown) so the AMR angle sensor package 400 may be sold and/or delivered for use as an assembled unit. In an embodiment, the AMR angle sensor 102 may have a planar area less than 2 mm×2 mm; an area less than 1.6 mm×1.6 mm; or an area less than 1.2 mm×1.2 mm. In an embodiment, the AMR angle sensor 102 may not be square but may be rectangular in planar shape.

Figure 7:
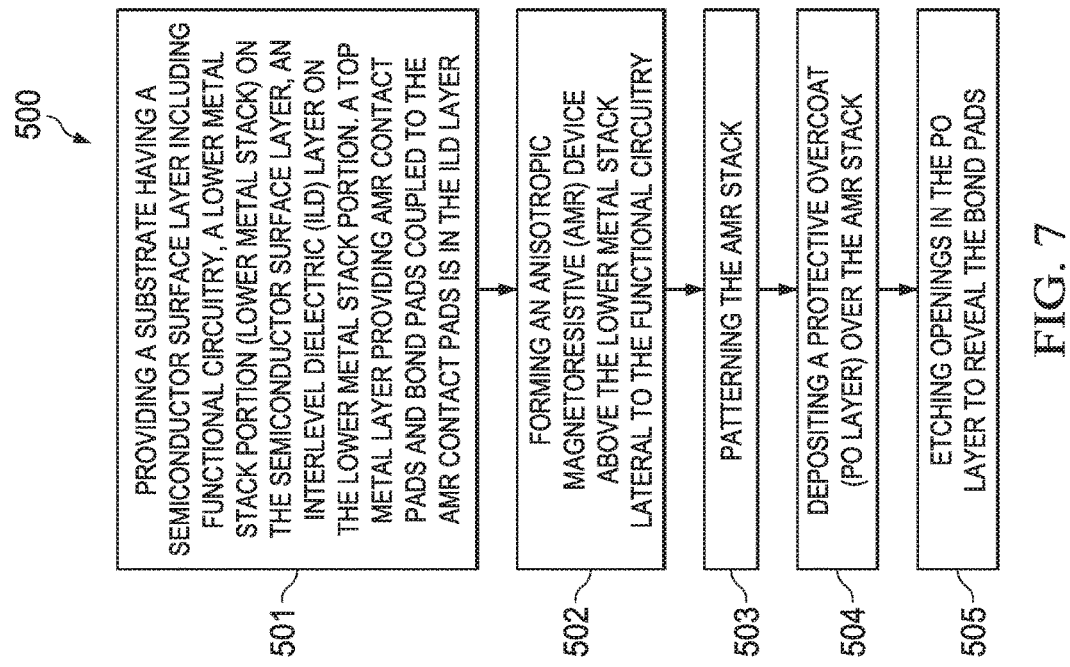
FIG. 7 is a flow chart that shows steps in an example method of forming an integrated device including an anisotropic magneto-resistive (AMR) angle sensor according to an embodiment of the disclosure.

FIG. 7 is a flow chart that shows steps in an example method 500 for forming an integrated device including an AMR sensor 300, according to an example embodiment. Method 500 is a thin-film-resistor (TFR)-like process to form the AMR sensor 300 so that there are only minimal changes to the existing semiconductor process flow utilized to form integrated circuits, which is generally a complementary metal-oxide-semiconductor (CMOS) process. Step 501 comprises providing a substrate 508 (for reference numbers shown for method 500 see FIG. 8 described below) having a semiconductor surface layer 509 including functional circuitry 580, a lower metal stack 530 on the semiconductor surface layer 509, and an ILD layer 540 on the lower metal stack 530. The substrate 508 and/or semiconductor surface 509 can comprise silicon, silicon-germanium, or other semiconductor material. One particular arrangement is a silicon/germanium (SiGe) semiconductor surface 509 on a silicon substrate 508.

A top metal layer 550 in the ILD layer 540 provides AMR contact pads 550*a* and 550*b* and bond pads 581, 582 which are coupled to the AMR contact pads 550*a* and 550*b*, shown in FIG. 8 coupled together by top metal layer coupling traces 558. Although shown in FIG. 8 differently from the top metal layer 550, the top metal layer coupling traces 558 comprise the top metal layer 550 and are thus the same thickness as the bond pads 581, 582 and AMR contact pads 550*a* and 550*b*. The top metal layer coupling traces 558 which add some interconnect resistance to their respective AMR resistors should be matched to provide essentially the same interconnect resistance to maintain the resistor balance of the AMR resistors inside the Wheatstone bridge.

A top ILD layer 545 can optionally be on the top metal layer 550 (see FIG. 9 described below). The top metal layer 550 can comprise aluminum or copper. There is generally 3 layers of metal interconnect, but there can be 2 layers of metal interconnect, or more than 3 layers of metal interconnect. The bond pads 581, 582 can be traditional bondpads comprising Al or Cu enabling wirebonding to.

In the case of the top metal layer 550 comprising aluminum which is highly reflective, the method 500 can further comprise forming refractory metal comprising pads (refractory metal pads) 552, such as titanium nitride (TiN) pads on the top metal layer 550 which acts as anti-reflective coating (ARC) layer to facilitate lithography. However, the refractory metal pads 552 may be removed, such as during the PO layer etch to open the bond pads 581 and 582 (see step 505 described below).

The functional circuitry 580 includes at least CMOS circuitry, as well asoptionally Bipolar Junction Transistors (BJTs) and/or power devices as well. The integrated device can also include precision analog elements such as Thin Film Resistors (TFRs) and capacitors which can be placed in metal layers such as the M1 to M3 layers. The AMR resistors formed in step 502 described below will typically be in a dual-Wheatstone Bridge arrangement, with one AMR bridge at a 45 degree rotation with respect to the other AMR bridge. The functional circuitry can apply a voltage onto the Wheatstone Bridge or serve as a current source. The output of the Wheatstone Bridge measures a voltage and the output circuitry can include a low noise amplifier with low noise attributes to amplify a sensor output signal generally about 20 µV or less. In addition the two Wheatstone bridges can have some voltage offset as the AMR resistors are generally not perfectly matched. Two output amplifiers, one for each bridge, can sense this offset and correct the offset to high precision.

Step 502 comprises forming an AMR device 560 above the lower metal stack 530 lateral to the functional circuitry 580. The AMR device 560 may be substantially similar to the AMR angle sensor 300 described above. The AMR device 560 may take any one of the forms illustrated in FIG. 5A, FIG. 5B, or FIG. 5C, or another alternative embodiment of the AMR angle sensor described herein having narrow gaps 306 and/or having the surrounding of anisotropic magneto-resistive material 304, where the surrounding material 304 may be disposed between the serpentine resistors and may be disposed in a central portion of the generally octagonal shaped AMR device 560. An AMR stack is deposited beginning with a seed layer 561, then an AMR material layer 562, then a capping layer 563. Layers 561-563 can be deposited in one deposition system without breaking a vacuum. In another embodiment the seed layer 561 can be deposited in a first deposition tool and then be moved to a second deposition tool for depositing the AMR material layer 562 and the capping layer 563. In this other embodiment before AMR material layer 562 is deposited a pre-sputter etch can be used to etch the surface of the seed layer 561 to remove any oxide layer that may have formed.

The seed layer 561 provides a seed for the AMR material layer 562 such as NiFe to form a <111> crystal texture which yields the maximum magneto-resistance. The seed layer 561 is coupled to AMR contact pads 550*a* and 550*b*. FIG. 2 described below shows a coupling structure comprising metal filled AMR vias 553 that couple the seed layer 561 to the AMR contact pads 550*a*, 550*b*, while FIG. 3 described below shows a coupling structure of refractory metal pads 552 (e.g., TiN) as an ARC in the case the top metal layer 550 comprises aluminum for coupling the seed layer 561 to the AMR contact pads 550*a*, 550*b*. There may also be no coupling structure (the seed layer 561 being directly on the AMR contact pads 550*a*, 550*b*). The capping layer 563 can comprise a dielectric material, such as AlN. The capping layer 563 can also comprise an electrically conductive material such as Ta, or TaN.

The material for the seed layer 561 should generally be as high a resistivity as possible, but there may be physical limits and the seed layer 561 will always conduct some amount of current. In one embodiment the seed layer 561 comprises a tantalum nitride (TaN) layer. The seed layer 561 can also comprise Ta, IrMn or Ti. As noted above a secondary purpose of the seed layer 561 is to be a seed for <111> texture growth of the NiFe as the AMR material layer 562 which provides a maximum magneto-resistance effect. Accordingly, a tradeoff exists for the seed layer 561, being thick enough to form an AMR material layer 562 such as <111> NiFe, but thin enough not to conduct significant current. In the case of TaN more N increases the seed layer 561 resistance but if too high in N the TaN layer can become unstable and thus can delaminate or peel off. The thickness of seed layer 561 can be 50-300 A, such as 100 A of sputtered TaN which as described above can get sputter etched before depositing the AMR material layer 562 to a lower thickness value of around 60 A.

The AMR stack can be deposited directly on a portion of the top metal layer 550 or on refractory metal pads 552 that are on the top metal layer 550. In one particular embodiment the seed layer 561 comprises TaN, the AMR material layer 562 comprises NiFe, and the capping layer 563 comprises AlN.

Step 503 comprises patterning the AMR stack. One embodiment is a single step patterning and etching for all layers of the stack. In another embodiment a mask is used to dry (or wet) etch the seed layer 561 first. This seed layer mask can be a bit larger (e.g., 0.1 μm) than the AMR material layer 562 mask (which also etches the capping layer 563) to provide a small (e.g., 0.2 μm) extension of the seed layer 561 out from the AMR material layer 562 (See FIG. 9 described below). The AMR material layer 562 and capping layer 563 can then be wet etched together, or dry etched together. This feature allows benefits such as making sure the metal filled AMR vias (e.g., tungsten (W) plugs) are not exposed to the AMR material layer 562 wet etch chemicals. The AMR stack can be formed in a serpentine pattern that is connected electrically in a Wheatstone bridge arrangement. There are various known ways of making a serpentine resistor. In an embodiment, part of the step 503 of patterning the AMR stack comprises isolating the surrounding of magneto-resistive material 304 of the AMR device 560 from the serpentine resistors, where the surrounding material 304 surrounds the generally octagonal form of the AMR sensor 300, is disposed between the serpentine resistors of the AMR sensor 300, and optionally is disposed in a central region of the AMR sensor 300. The surrounding of magneto-resistive material 304 is not connected to vias 553. In an embodiment, part of the step 503 of patterning the AMR device 560 comprises separating the strips of the serpentine resistors by narrow gaps 306.

Step 504 comprises depositing a PO layer 590 over the AMR stack. The PO layer comprises a dielectric layer such as silicon oxide, silicon nitride or SiON. The PO layer 590 is thus deposited after forming the patterned AMR stack and is directly on the capping layer 563 and the top surface of the top metal layer 550. Step 505 comprises etching openings 590a in the PO layer to reveal the bond pads 581, 582. This allows assembly wirebonding to the AMR device 560.

In one embodiment (see FIG. 8 described below), the providing step further includes a top ILD layer 545 on the top metal layer 550, and the method further comprises etching AMR vias in the top ILD layer 545 over the AMR contact pads 550a and 550b, and filling the AMR vias with a metal filler material (e.g., W) and planarizing (e.g., CMP) to form metal filled AMR vias 553 which contact the AMR contact pads 550a and 550b. In this embodiment the seed layer 561 is formed over the metal filled vias 553.

FIG. 8 is a cross-sectional view of an example integrated device 600 having metal filled vias 553 coupling the seed layer to the AMR contact pads 550a and 550b, according to an example embodiment. Here the AMR stack (e.g., AlN/NiFe/TaN) land on metal filled vias 553 which can comprises small W filled vias. An example standard via process comprises depositing a silicon oxide dielectric, etching via holes in the dielectric, sputtering tungsten (W) to fill the via holes, and Chemical Mechanical Polishing (CMP) back the W to form a planar oxide surface. The method to realize integrated device 600 only generally involves two masks added (AMR Via, and the AMR stack pattern). Although not shown, there can also optionally be dummy patterns of AMR stacks for improving resistance matching.

The AMR vias can be designed in various ways. In one arrangement the AMR vias can be standard vias (e.g., square shaped) that in the final device can form a 2D array of such vias which are contained entirely within the AMR material layer 562. The AMR vias can also be a rectangular vias that can be the same width as the standard via in the process (e.g., 0.28 μm), and can be long and extend the entire width of the AMR material layer 562, such as about 10 μm long. The rectangular AMR via can be a single long AMR via or be multiple long AMR vias. The rectangular AMR vias can be contained entirely within the AMR material layer 562, or can extend out past the edge of the AMR layer in the width direction.

FIG. 9 is a cross-sectional view of another example integrated device 700 having the seed layer directly on refractory metal pads 552 on the AMR contact pads 550a and 550b, according to an example embodiment. As noted, the seed layer 561 is shown extending out from the AMR material layer 562. In this embodiment the AMR stack (e.g., ALN/NiFe/TaN) lands on the AMR contact pads 550a and 550b directly (such as in the case of Cu top metal layer 550) or as shown on the refractory metal pads 552 shown on the AMR contact pads 550a and 550b (such as in the case of an Al top metal layer 550). The method to realize integrated device 700 only generally involves one mask added (AMR stack pattern).

Figure 10:
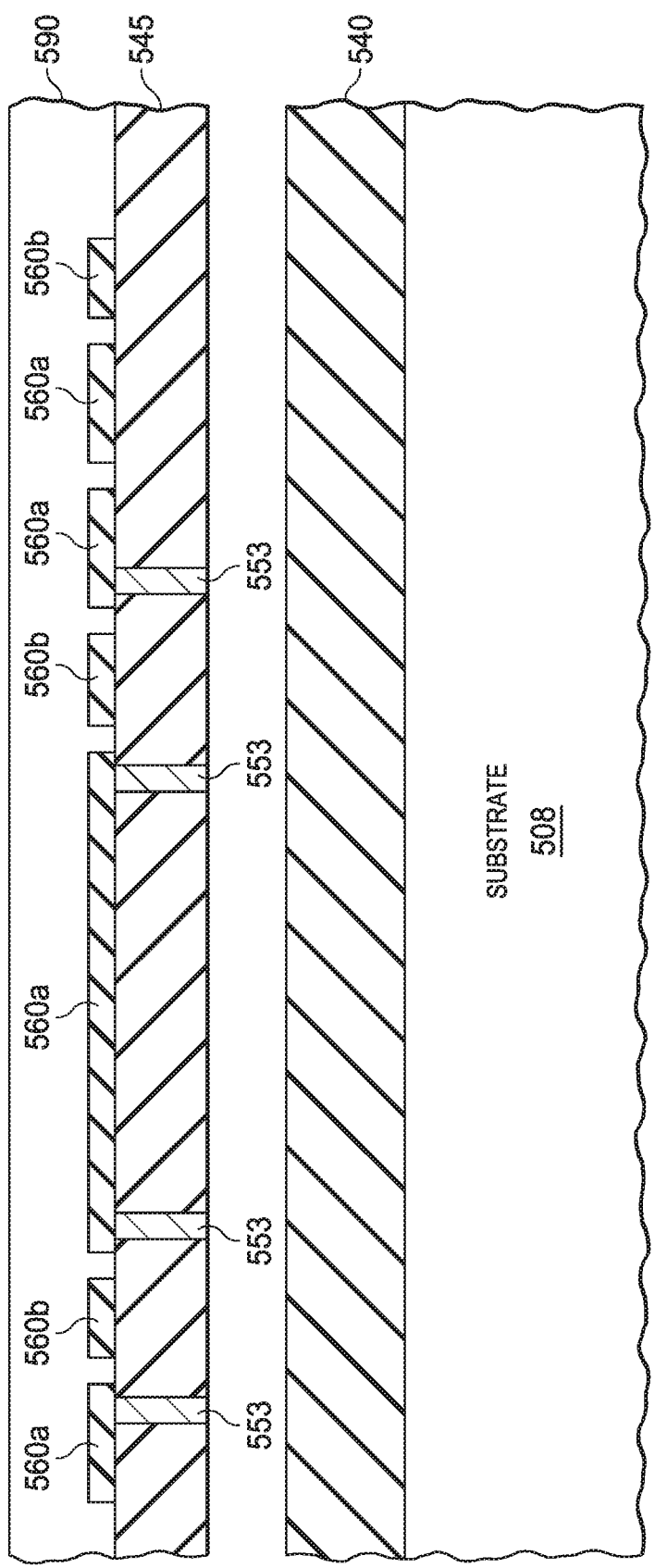
FIG. 10 is a cross-sectional detail view of an integrated device including an anisotropic magneto-resistive (AMR) angle sensor according to an embodiment of the disclosure.

Turning now to FIG. 10, a detailed view of the AMR device 600, 700 is described. The view of FIG. 10 shows the strips of anisotropic magneto-resistive material 560a separated from the surrounding of anisotropic magneto-resistive material 560b. The surrounding of anisotropic magneto-resistive material 560b corresponds to the surrounding of anisotropic magneto-resistive material 304 described above with reference to FIG. 5A, FIG. 5B, and FIG. 5C. The strips of anisotropic magneto-resistive material 560a corresponds to the strips of anisotropic magneto-resistive material 302 described above with reference to FIG. 5A, FIG. 5B, and FIG. 5C.

While several embodiments have been provided in the present disclosure, the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. An anisotropic magneto-resistive (AMR) angle sensor, comprising:
   a first Wheatstone bridge comprising a first serpentine resistor, a second serpentine resistor, a third serpentine resistor, and a fourth serpentine resistor;
   a second Wheatstone bridge comprising a fifth serpentine resistor, a sixth serpentine resistor, a seventh serpentine resistor, and an eighth serpentine resistor;
   wherein the serpentine resistors comprise anisotropic magneto-resistive material that changes resistance in response to a change in an applied magnetic field, and a surrounding of anisotropic magneto-resistive material disposed in substantially a same plane as the serpentine resistors, enclosing the serpentine resistors, and electrically isolated from the serpentine resistors, wherein the first Wheatstone bridge, the second Wheatstone bridge, and the surrounding of anisotropic magneto-resistive material are part of a sensor die.

2. The AMR angle sensor of claim 1, wherein each of the serpentine resistors defines a substantially trapezoidal polygon disposed in substantially a same plane as the other serpentine resistors, the serpentine resistors are disposed to define a substantially regular octagonal polygon, the fifth serpentine resistor is located between the first serpentine resistor and the second serpentine resistor, the sixth serpentine resistor is located between the second serpentine resistor and the third serpentine resistor, the seventh serpentine resistor is located between the third and the fourth serpentine resistor, and the eighth serpentine resistor is located between the fourth serpentine resistor and the first serpentine resistor.

3. The AMR angle sensor of claim 2, wherein the surrounding of anisotropic magneto-resistive material enclosing the serpentine resistors further is disposed between the serpentine resistors.

4. The AMR angle sensor of claim 1, wherein the electrical isolation between the surrounding of anisotropic magneto-resistive material and the serpentine resistors is less than 2 μm wide.

5. The AMR angle sensor of claim 1, wherein the electrical isolation between the surrounding of anisotropic magneto-resistive material and the serpentine resistors is provided by etching that is less than 1 μm wide.

6. The AMR angle sensor of claim 1, wherein a planar area of the sensor die is less than 1.2 mm×1.2 mm.

7. The AMR sensor of claim 1, further comprising an analog front end (AFE) electrically coupled to the sensor die that provides electrical power to the sensor die and provides signal conditioning to outputs of the sensor die.

8. An anisotropic magneto-resistive (AMR) angle sensor, comprising:
   a first Wheatstone bridge comprising a first serpentine resistor, a second serpentine resistor, a third serpentine resistor, and a fourth serpentine resistor;
   a second Wheatstone bridge comprising a fifth serpentine resistor, a sixth serpentine resistor, a seventh serpentine resistor, and an eighth serpentine resistor,
   wherein the serpentine resistors each define a substantially trapezoidal polygon disposed in substantially a same plane as the other serpentine resistors, the serpentine resistors are disposed to define a substantially regular octagonal polygon, the fifth serpentine resistor is located between the first serpentine resistor and the second serpentine resistor, the sixth serpentine resistor is located between the second serpentine resistor and the third serpentine resistor, the seventh serpentine resistor is located between the third and the fourth serpentine resistor, and the eighth serpentine resistor is located between the fourth serpentine resistor and the first serpentine resistor,
   wherein the serpentine resistors comprise anisotropic magneto-resistive material that changes resistance in response to a change in an externally-applied magnetic field; and
   a surrounding of anisotropic magneto-resistive material disposed in substantially the same plane as the serpentine resistors, enclosing the serpentine resistors and electrically isolated from the serpentine resistors.

9. The AMR angle sensor of claim 8, wherein each of the serpentine resistors comprises a plurality of substantially parallel strips of anisotropic magneto-resistive material interconnected by metal contacts.

10. The AMR angle sensor of claim 9, wherein the strips of anisotropic magneto-resistive material of the first serpentine resistor are substantially parallel to the strips of anisotropic magneto-resistive material of the third serpentine resistor, the strips of anisotropic magneto-resistive material of the second serpentine resistor are substantially parallel to the strips of anisotropic magneto-resistive material of the fourth serpentine resistor, the strips of anisotropic magneto-resistive material of the fifth serpentine resistor are substantially parallel to the strips of anisotropic magneto-resistive material of the seventh serpentine resistor, and the strips of anisotropic magneto-resistive material of the sixth serpentine resistor are substantially parallel to the strips of anisotropic magneto-resistive material of the eighth serpentine resistor.

11. The AMR angle sensor of claim 10, wherein the strips of anisotropic magneto-resistive material of the first and third serpentine resistors are substantially orthogonal to the strips of anisotropic magneto-resistive material of the second and third serpentine resistors and the strips of anisotropic magneto-resistive material of the fifth and seventh serpentine resistors are substantially orthogonal to the strips of anisotropic magneto-resistive material of the sixth and eighth serpentine resistors.

12. The AMR angle sensor of claim 11, wherein the strips of anisotropic magneto-resistive material of the first serpentine resistor are offset by −45 degrees or +45 degrees to the strips of anisotropic magneto-resistive material of the fifth serpentine resistor and the strips of anisotropic magneto-resistive material of the eighth serpentine resistor.

13. The AMR angle sensor of claim 8, wherein the anisotropic magneto-resistive material comprises nickel and iron.

14. The AMR angle sensor of claim 8, wherein a planar area of the AMR angle sensor is less than 1.2 mm×1.2 mm.

15. An anisotropic magneto-resistive (AMR) angle sensor die, comprising:
   a first Wheatstone bridge comprising a first serpentine resistor, a second serpentine resistor, a third serpentine resistor, and a fourth serpentine resistor;
   a second Wheatstone bridge comprising a fifth serpentine resistor, a sixth serpentine resistor, a seventh serpentine resistor, and an eighth serpentine resistor,
   wherein each of the serpentine resistors defines a substantially trapezoidal polygon disposed in substantially the same plane as the other serpentine resistors, the serpentine resistors are disposed to define a substantially regular octagonal polygon, the fifth serpentine resistor is located between the first serpentine resistor and the second serpentine resistor, the sixth serpentine resistor is located between the second serpentine resistor and the third serpentine resistor, the seventh serpentine resistor is located between the third and the fourth serpentine resistor, and the eighth serpentine resistor is located between the fourth serpentine resistor and the first serpentine resistor,
   wherein the serpentine resistors comprise anisotropic magneto-resistive material that changes resistance in response to a change in an externally-applied magnetic field, and
   a surrounding of anisotropic magneto-resistive material disposed in substantially the same plane as the serpentine resistors, enclosing an outer perimeter of the regular octagonal polygon defined by the serpentine resistors, disposed between the serpentine resistors, and electrically isolated from the serpentine resistors.

16. The AMR angle sensor die of claim 15, wherein the anisotropic magneto-resistive material comprises nickel and iron.

17. The AMR angle sensor die of claim 15, wherein the AMR angle sensor die has a planar area of less than 2 mm×2 mm.

18. The AMR angle sensor die of claim 15, wherein the AMR angle sensor die has a planar area of less than 1.2 mm×1.2 mm.

19. The AMR angle sensor die of claim 15, wherein the electrical isolation between the surrounding of anisotropic magneto-resistive material and the serpentine resistors is less than 2 µm wide.

20. The AMR angle sensor die of claim 15, wherein the electrical isolation between the surrounding of anisotropic magneto-resistive material and the serpentine resistors is less than 1 µm wide.

21. A method of forming an integrated device, comprising:
providing a substrate having a semiconductor surface layer including functional circuitry, a lower metal stack on the semiconductor surface layer, an interlevel dielectric (ILD) layer on the lower metal stack, a top metal layer providing AMR contact pads and bond pads coupled to the AMR contact pads in the ILD layer;
forming an anisotropic magneto-resistive (AMR) device above the lower metal stack lateral to the functional circuitry including depositing an AMR stack including a seed layer, an AMR material layer then a capping layer, wherein the seed layer is coupled to the AMR contact pads;
patterning the AMR stack, comprising isolating a surrounding of magneto-resistive material from a plurality of serpentine resistors of the AMR stack;
depositing a protective overcoat (PO layer) over the AMR stack; and
etching openings in the PO layer to reveal the bond pads.

22. The method of claim 21, wherein patterning the AMR stack further comprises separating strips of the serpentine resistors by a narrow gap.

23. The method of claim 22, wherein the narrow gap is less than 1.5 µm.

* * * * *